United States Patent
Huang et al.

(10) Patent No.: US 10,209,723 B2
(45) Date of Patent: Feb. 19, 2019

(54) LOW-VOLTAGE DIFFERENTIAL SIGNALING DRIVING CIRCUIT

(71) Applicant: MStar Semiconductor, Inc., Hsinchu Hsien (TW)

(72) Inventors: Yu-Hsiang Huang, Zhubei (TW); Jyun-Yang Shih, Zhubei (TW); Chun-Chia Chen, Zhubei (TW)

(73) Assignee: MSTAR SEMICONDUCTOR, INC., Hsinchu Hsien (TW)

( * ) Notice: Subject to any disclaimer, the term of this patent is extended or adjusted under 35 U.S.C. 154(b) by 0 days.

(21) Appl. No.: 15/198,007

(22) Filed: Jun. 30, 2016

(65) Prior Publication Data

US 2017/0026037 A1 Jan. 26, 2017

(30) Foreign Application Priority Data

Jul. 24, 2015 (TW) .............................. 104124056 A

(51) Int. Cl.
*H03K 17/687* (2006.01)
*G05F 1/56* (2006.01)
*H03K 19/0185* (2006.01)

(52) U.S. Cl.
CPC ....... *G05F 1/56* (2013.01); *H03K 19/018578* (2013.01); *H03K 2217/0036* (2013.01)

(58) Field of Classification Search
None
See application file for complete search history.

(56) References Cited

U.S. PATENT DOCUMENTS

| | | |
|---|---|---|
| 7,532,048 B1 | 5/2009 | Shirani et al. |
| 7,595,661 B2 | 9/2009 | Kim |
| 8,258,813 B2 | 9/2012 | Groepl et al. |
| 8,638,156 B2 | 1/2014 | Shibata et al. |
| 9,065,399 B2 | 6/2015 | Wang et al. |
| 9,362,915 B1* | 6/2016 | Phillippe ............ H03K 19/0175 |

(Continued)

FOREIGN PATENT DOCUMENTS

| | | |
|---|---|---|
| CN | 1531777 A | 9/2004 |
| CN | 101764626 A | 6/2010 |

OTHER PUBLICATIONS

TIPO Office Action, dated Sep. 22, 2016, 9 pages.
TIPO Office Action, dated Jun. 24, 2016, 9 pages.
SIPO Office Action, dated Sep. 3, 2018, 12 pages.

*Primary Examiner* — Cassandra Cox
(74) *Attorney, Agent, or Firm* — Edell, Shapiro & Finnan, LLC

(57) ABSTRACT

A low-voltage differential signaling (LVDS) driving circuit, coupled to a load resistor via a first output end and a second output end, includes: a voltage generating unit, providing a first reference voltage; a first switch, coupled between the voltage generating unit and a first node; a second switch, coupled between the voltage generating unit and a second node; a third switch, coupled between the first node and a third node, the third node having a second reference voltage; a fourth switch, coupled between the second node and the third node; a first resistor, coupled between the first node and the first output end; and a second resistor, coupled between the second node and the second output end. The first resistor and the second resistor are in a series connection with the load resistor.

16 Claims, 10 Drawing Sheets

(56) References Cited

U.S. PATENT DOCUMENTS

2007/0285120 A1\* 12/2007 Venditti ......... H03K 19/017581
                                                         326/30
2010/0073036 A1\*  3/2010 Takeuchi .............. H03F 3/4521
                                                         327/108
2013/0300455 A1\* 11/2013 Thirugnanam ............................
                                                    H03K 19/018514
                                                         326/82
2015/0188537 A1\*  7/2015 Isoda ................ H03K 19/0185
                                                         327/108

\* cited by examiner

LOW-VOLTAGE DIFFERENTIAL SIGNALING DRIVING CIRCUIT

This application claims the benefit of Taiwan application Serial No. 104124056, filed Jul. 24, 2015, the subject matter of which is incorporated herein by reference.

BACKGROUND OF THE INVENTION

Field of the Invention

The invention relates in general to a low-voltage differential signaling (LVDS) driving circuit, and more particularly to a voltage mode LVDS driving circuit.

Description of the Related Art

Low-voltage differential signaling (LVDS), providing good performance as well featuring advantages of low power consumption, low noise, low electromagnetic interference (EMI) and low costs, is extensive applied in high-speed data transmission. FIG. 1 shows a schematic diagram of a conventional LVDS transceiving circuit. A transmitter (or referred to as an LVDS driving circuit) and a receiver of the LVDS transceiving circuit are bordered by the dotted line in the drawing, and the part located on the left side of the dotted line is the LVDS driving circuit. The LVDS driving circuit transmits signals to the receiver at the right side of the dotted line via transmission lines 140 and 145. The LVDS driving circuit includes a current source 110, a switch 122, a switch 124, a switch 126, a switch 128, another current source 115 and a resistor 130. The four switches 122, 124, 126 and 128 may be implemented by p-type metal oxide semiconductor transistors (to be referred to as PMOS) and n-type metal oxide semiconductor transistors (to be referred to as NMOS). In this example, the switches 122 and 124 are implemented by PMOS, and have respective sources coupled to the current sources 110, respective gates as control ends, and respective drains coupled to the switches 126 and 128, respectively. The switches 126 and 128 are implemented by NMOS, and have respective gates as control ends, respective sources coupled to the current source 115, and respective drains coupled to the drains of the switches 122 and 124, respectively. A connecting node of the switches 122 and 126 and a connecting node of the switches 124 and 128 serve as two output ends (respectively coupled to the transmission line 140 and the transmission line 145) of the LVDS driving circuit, and a resistor 130 is coupled between the two output ends. Operations of the LVDS driving circuit are divided into two stages. In the first stage, the switches 122 and 128 are turned on, and the switches 124 and 126 are turned off. At this point, the current Iout flows towards the direction indicated by the arrow as shown, undergoes alternating-current coupling at the coupling capacitors 150 and 155 at the receiver, and generates a cross voltage VOD at the load resistor 160. In the second stage, the switches 124 and 126 are turned on, and the switches 122 and 128 are turned off. At this point, the current passing the resistor 130 and the load resistor 160 changes from flowing downwards to flowing upwards, hence generating a different cross voltage VOD at the receiver. The receiver may then learn the information transmitted from the transmitter according to the change in the cross voltage VOD.

The resistor 130 is a matching resistor of the LVDS driving circuit. Further, because the driving circuit is driven by the current source 110 and the current source 115, the resistor 130 and the load resistor 160 of the receiver are in a parallel connection and both having a resistance value R. If the resistance value is 100Ω, the equivalent resistance value is 50Ω when the resistor 130 and the load resistor 160 of the receiver are in a parallel connection. Assuming that the cross voltage VOD of the load resistor 160 needs to be 400 mV, the current Iout of the LVDS driving circuit needs to be 400 mV/50Ω=8 mA. That is to say, due impedance matching, the LVDS driving circuit is required to output a large current in order to drive the receiver. Further, as the current source 110 and the current source 115 need to be driven by a larger voltage, the LVDS driving circuit requires a higher voltage VDD, e.g., 2.5V or 3.3V. A drawback of using a high voltage VDD not only increases the overall power consumption (VDD×Iout) of the driving circuit, but also causes the switches 122, 124, 126 and 128 to adopt large-sized components for withstanding a higher operating voltage. For example, I/O devices, whose channel length is usually between 450 nm and 550 nm, need to be used. Such large-sized components indirectly cause a front-end circuit (e.g., an inverter) of the LVDS driving circuit to encounter a larger load, such that the current consumption of the front-end circuit and power noise are both increased.

SUMMARY OF THE INVENTION

It is an object of the present invention to provide a low-voltage differential signaling (LVDS) driving circuit to reduce an output current and to save power consumption.

The present invention discloses an LVDS driving circuit. The LVDS driving circuit, coupled to a load resistor via a first output end and a second output end, includes: a voltage generating unit, providing a first reference voltage; a first switch, coupled between the voltage generating unit and a first node; a second switch, coupled between the voltage generating unit and a second node; a third switch, coupled between the first node and a third node, the third node having a second reference voltage; a fourth switch, coupled between the second node and the third node; a first resistor, coupled between the first node and the first output end; and a second resistor, coupled between the second node and the second output end. The first resistor and the second resistor are in a parallel connection with the load resistor.

The present invention further discloses an LVDS driving circuit. The LVDS driving circuit, coupled to a resistor load via a first output end and a second output end, includes: a voltage generating unit, providing a first reference voltage; a first switch, coupled between the voltage generating unit and a first node; a second switch, coupled between the voltage generating unit and a second node; a third switch, coupled between the first node and a third node, the third node having a second reference voltage; a fourth switch, coupled between the second node and the third node; and a plurality of resistors. When the first switch and the fourth switch are turned on and the second switch and the third switch are turned off, the first switch, the first node, the fourth switch, the second node and the load resistor form a current path. A part of the resistors are located on the current path, and are in a series connection with the load resistor.

The present invention further discloses a differential signaling driving circuit. The differential signaling driving circuit, coupled to a remote load, includes: a differential pair, providing a bias voltage by a first reference voltage and a second reference voltage, including a pair of differential output ends; and a pair of proximal matching components, respectively disposed between the pair of differential outputs and the remote load, such that the pair of proximal matching components are in series connection with the remote load.

The LVDS driving circuit of the present invention is voltage-driven, and the matching impedance and the load resistor of a receiver are caused to be in a series connection.

Compared to the prior art, the present invention not only achieves the same transmission effect by using a lower output current, but also reduces the overall power consumption as the voltage used by the driving circuit is lower. Further, the lower driving voltage allows MOS serving as switches with a reduced size, which helps alleviating the load of a front-end circuit.

The above and other aspects of the invention will become better understood with regard to the following detailed description of the preferred but non-limiting embodiments. The following description is made with reference to the accompanying drawings.

DETAILED DESCRIPTION OF THE INVENTION

Technical terms of the application are based on general definition in the technical field of the application. If the application describes or explains one or some terms, definition of the terms are based on the description or explanation of the application.

The disclosure includes a low-voltage differential signaling (LVDS) driving circuit capable of transmitting signals by a low output current. In possible implementation, one skilled person in the art may choose equivalent elements or steps to implement the disclosure based on the disclosure of the application. That is, the implementation of the disclosure is not limited in the embodiments disclosed in the disclosure. Further, a part of the elements included in the circuit for calculating an error of a sampling clock and the LVDS driving circuit of the disclosure may be individually known elements. Without affecting the full disclosure and possible implementation of the device, details of the known elements are omitted.

Figure 2:
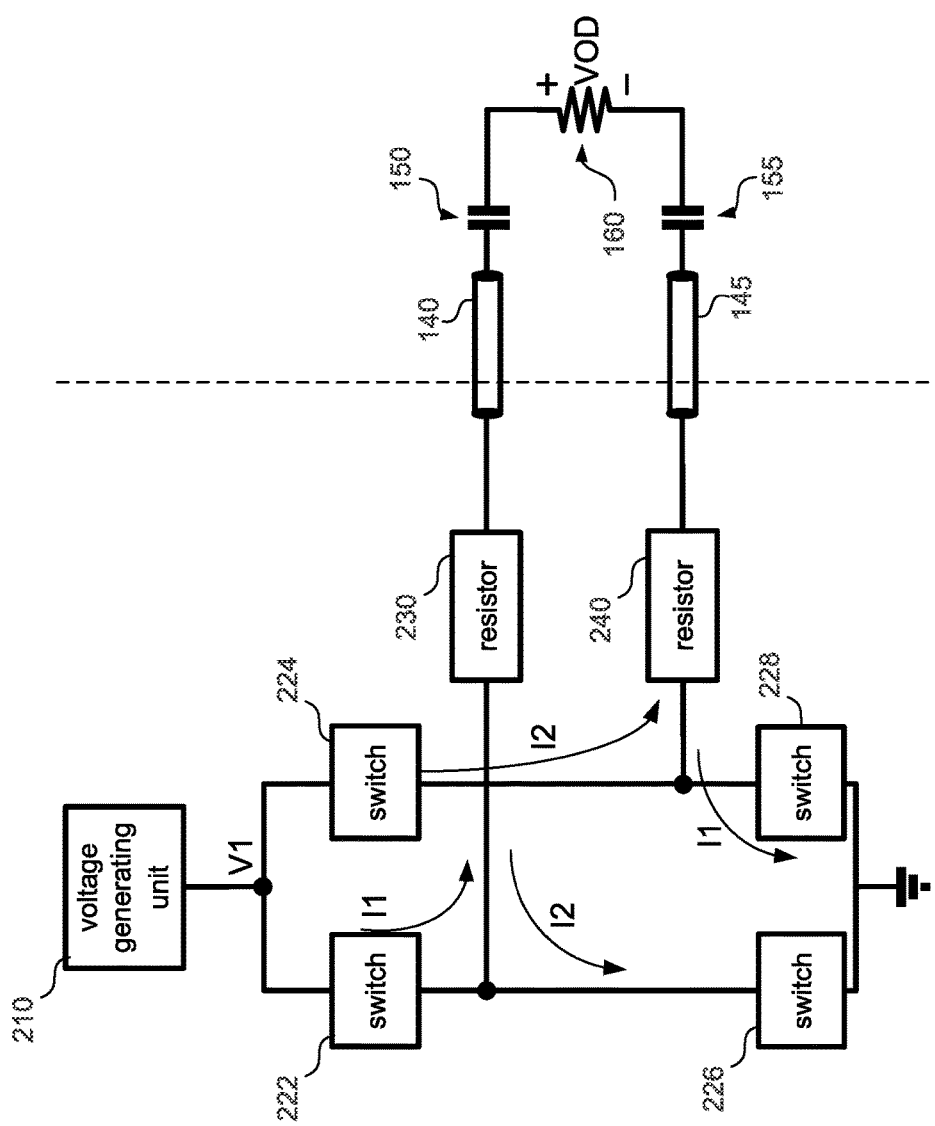
FIG. 2 is a circuit diagram of an LVDS transceiving circuit according to an embodiment of the present invention.

FIG. 2 shows a circuit diagram of an LVDS transceiving circuit according to an embodiment of the present invention. The LVDS transceiving circuit of the present invention includes a voltage generating unit 210, a switch 222, a switch 224, a switch 226, a switch 228, a resistor 230 and a resistor 240. Compared to the prior art, the LVDS driving circuit of the present invention is voltage driven, and so the resistor 230 and the resistor 240 used for impedance matching form a series connection with the load resistor 160 of the receiver. More importantly, in the present invention, unlike a reduced current flowing through the load resistor 160 due to a dividing effect of the impedance matching resistor 130 as the prior art, all of the output current may pass through the load resistor 160. In other words, given the same conditions and requirements as the prior art (the resistance value of the load resistor 160 being 100Ω, and the cross voltage VOD being 400 mV), the current (I1 or I2) in the present invention only needs to be 400 mV/100Ω=4 mA. That is, under the same output voltage amplitude, the current outputted by the LVDS driving circuit only needs to be one a half of that of the prior art.

Further, as the LVDS driving circuit of the present invention does not involve a current source, the voltage generating unit 210 only needs to provide a smaller voltage in a way that power consumption is reduced. For example, LVDS driving circuit of the present invention can be driven by a 1.2V VDD. Thus, the LVDS driving circuit has total power consumption of 1.2V×4 mV=4.8 mW, which is merely 24% of the power consumption of the prior art (assuming that the voltage VDD is 2.5V, the power consumption is then 2.5V×8 A=20 mW), hence being significantly power saving. Further, an additional benefit of using a low driving voltage is that, the switches 222, 224, 226 and 228 may be implemented by MOS in smaller sizes, e.g., replacing I/O devices by core devices that usually have a channel length of 28 nm or 40 nm. Such small-sized core devices indirectly allow the front-end circuit of the LVDS driving circuit to require a smaller output voltage for driving the driving circuit, thereby further reducing the current consumption of the front-end circuit as well as power noise.

Figure 1:
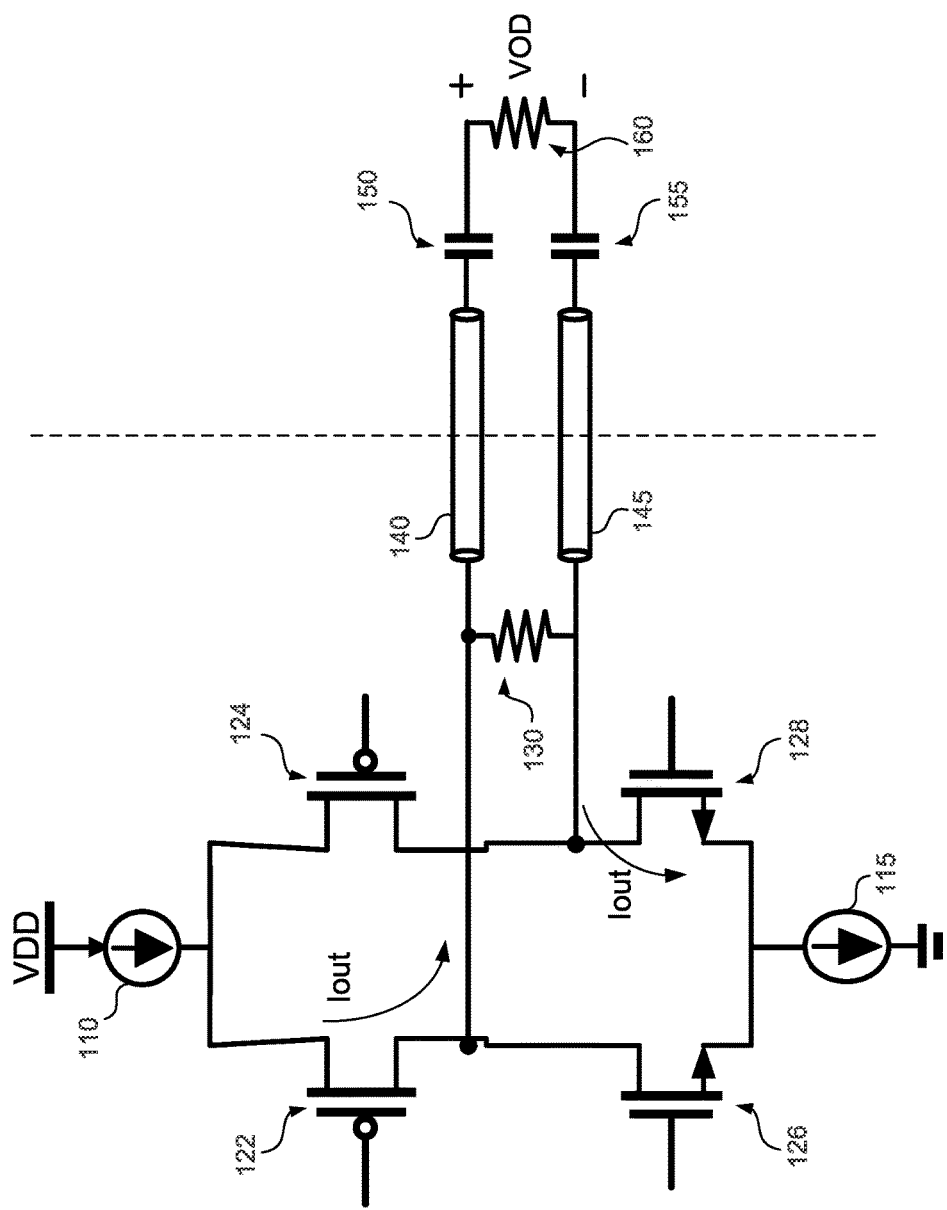
FIG. 1 is a circuit diagram of a conventional low-voltage differential signaling (LVDS) transceiving circuit.
Figure 3A:
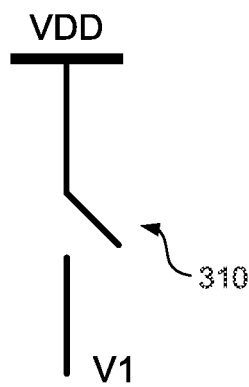
FIG. 3A and FIG. 3B are circuit diagrams of a voltage generating unit 210 of an LVDS driving circuit according two embodiments of the present invention.
Figure 3B:
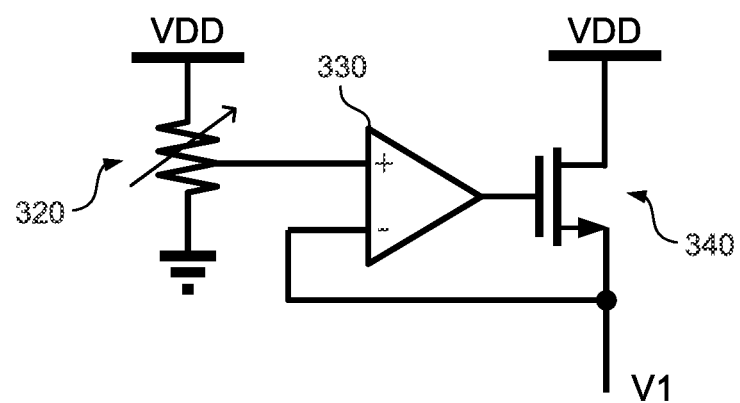
Figure 4A:
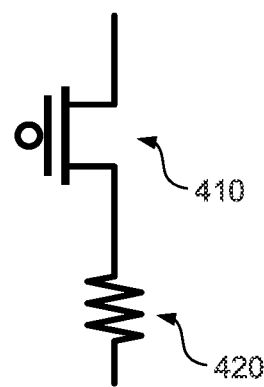
FIG. 4A and FIG. 4B are circuit diagrams of a switch 222 and a switch 224 of an LVDS driving circuit according two embodiments of the present invention.
Figure 4B:
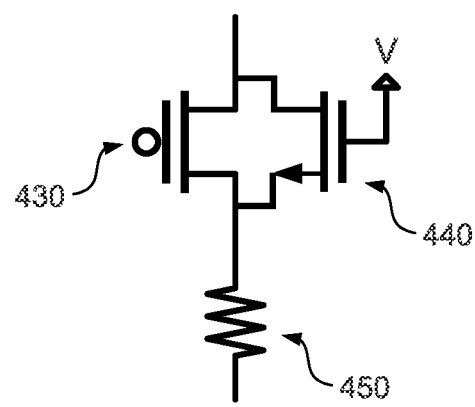
Figure 5:
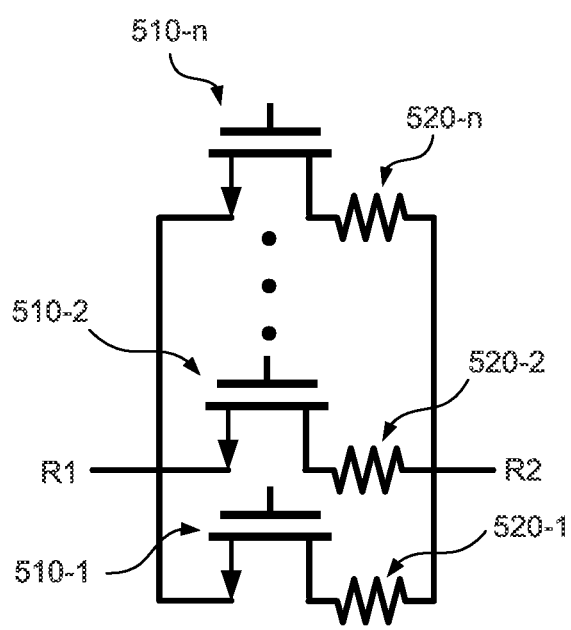
FIG. 5 is a circuit diagram of a resistor 230 or a resistor 240 of an LVDS driving circuit according an embodiment of the present invention.

The components in the LVDS driving circuit are described in detail in embodiments below to explain corresponding design requirements. The voltage generating unit 210 serves a main purpose of providing a stable voltage. FIG. 3A and FIG. 3B show circuit diagrams of the voltage generating unit 210 of an LVDS driving circuit according to two embodiments of the present invention. As shown in FIG. 3A, given a relative stable voltage VDD, the voltage generating unit 210 is capable of controlling an output of the voltage by using a simple switch 310. However, if the voltage VDD is unstable, as shown in FIG. 3B, the voltage generating unit 210 may generate a relatively stable voltage by using a low-voltage dropout (LDO) regulator. The voltage generating unit 210 includes a variable resistor 320, an operational amplifier 330 and an NMOS 340. Operation principles of the these components are generally known to one person skilled in the art, and shall be omitted herein. The switch 222 and the switch 224 are primarily formed by PMOS. For example, the switch 222 and the switch 224 may be the switch 122 and the switch 124 shown in FIG. 1 and generally including only PMOS, or may be formed by a PMOS 410 and a resistor 420 connected in series, as shown in FIG. 4A. The PMOS 410 has its source connected to a node V1 in FIG. 2, its drain connected to the resistor 420. The other end of the resistor 420 is connected to the switch 226 or the switch 228 and an output end of the LVDS driving circuit. Further, as shown in FIG. 4B, the switch 222 and the switch 224 may be formed by a PMOS 430, an NMOS 440 and a resistor 450 connected to one another. The source of the PMOS 430 is connected to the drain of the NMOS 440, and then together connected to the node V1 in FIG. 2. The drain of the PMOS 430 is connected to the source of the NMOS 440, and then together connected to the resistor 450. The other end of the resistor 450 is connected to the switch 226 or the switch 228 and the output end of the LVDS driving circuit. The implementation in FIG. 4B is capable of enhancing the linearity of a switch and causing circuit characteristics of the switch to be more similar to a resistor, hence helping adjusting the matching impedance of the LVDS driving circuit. The resistor 420 and the resistor 450 in FIG. 4A and FIG. 4B provide a current limiting function to aim at a providing electrostatic discharge (ESD) protection. The switch 226 and the switch 228 may be formed by NMOS. The drain of the NMOS is connected to the switch 222 or the switch 224 and the output end of the LVDS driving circuit, and the source is coupled to the ground. The resistors 230 and 240 may be implemented by simple resistors, or the MOS is biased in an active region to serve as a variable resistor. Alternatively, the resistors 230 and 240 may be implemented by the circuit in FIG. 5. In FIG. 5, the resistor 230 or the resistor 240 is formed by a plurality of sub-resistors. As shown in the diagram, the resistor 230 or the resistor 240 includes n groups (where n is a positive integer) of NMOS 510 and sub-resistors 520 in a parallel connection. The NMOS 510 in each group serves as a switch, and has its drain coupled to the corresponding sub-resistor 520. The sources of the NMOS 510 of different groups are connected to one another, and one other ends of the sub-resistors 520 of the groups are also connected to one another. One end R1 of the circuit in a parallel connection is connected to the switch 222, 224, 226 or 228, and the other end R2 is connected to the output end of the LVDS driving circuit. One benefit of the circuit in FIG. 5 is that, the number of resistors connected in parallel may be changed by simply setting on/off states of multiple NMOS 510 to further adjust the equivalent resistance value. The resistance values of the sub-resistors 520 may not be necessarily equal.

When matching impedance is designed, all resistors on a conduction path of the LVDS driving circuit need to be considered. For example, referring to FIG. 2, when the switch 222 and the switch 228 are turned on and the switch 224 and the switch 226 are turned off, the direction of the output current from the voltage generating unit 210 is as shown by the direction of the current I1 in the diagram. More specifically, after passing through the switch 222 and the resistor 230 from the inside of the LVDS driving circuit, all of the current is outputted from one of the output ends of the LVDS driving circuit, passes through the load resistor 160 of the receiver, returns into the LVDS driving circuit via the other output end of the LVDS driving circuit, and passes through the resistor 240 and the switch 228 to the ground. Thus, the conduction path in the LVDS driving circuit is the voltage generating unit 210, the switch 222, the resistor 230, the resistor 240 and the switch 228. On the other hand, when the switch 222 and the switch 228 are turned off and the switch 224 and the switch 226 are turned on, the direction of the output current from the voltage generating unit 210 is as shown by the direction of the current I2 in the diagram. More specifically, after passing through the switch 224 and the resistor 240 from the inside of the LVDS driving circuit, all of the current is outputted from one of the output ends of the LVDS driving circuit, passes through the load resistor 160 of the receiver, returns into the LVDS driving circuit via the other output end of the LVDS driving circuit, and passes through the resistor 230 and the switch 226 to the ground. Thus, the conduction path in the LVDS driving circuit is the voltage generating unit 210, the switch 224, the resistor 240, the resistor 230 and the switch 226. When the matching impedance of the conduction path corresponding to the current I1 is calculated, the switch 222, the resistor 230, the resistor 240 and the switch 228 are substantially in a series connection, and so the equivalent resistance is equal to a sum of the resistance value of the switch 222, the resistance value of the resistor 230, the resistance value of the resistor 240 and the resistance value of the switch 228. Similarly, when the matching impedance of the conduction path corresponding to the current I2 is calculated, the switch 224, the resistor 240, the resistor 230 and the switch 226 are substantially in a series connection, and so the equivalent resistance is equal to a sum of the resistance value of the switch 224, the resistance value of the resistor 240, the resistance value of the resistor 230, and the resistance value of the switch 226.

Figure 6:
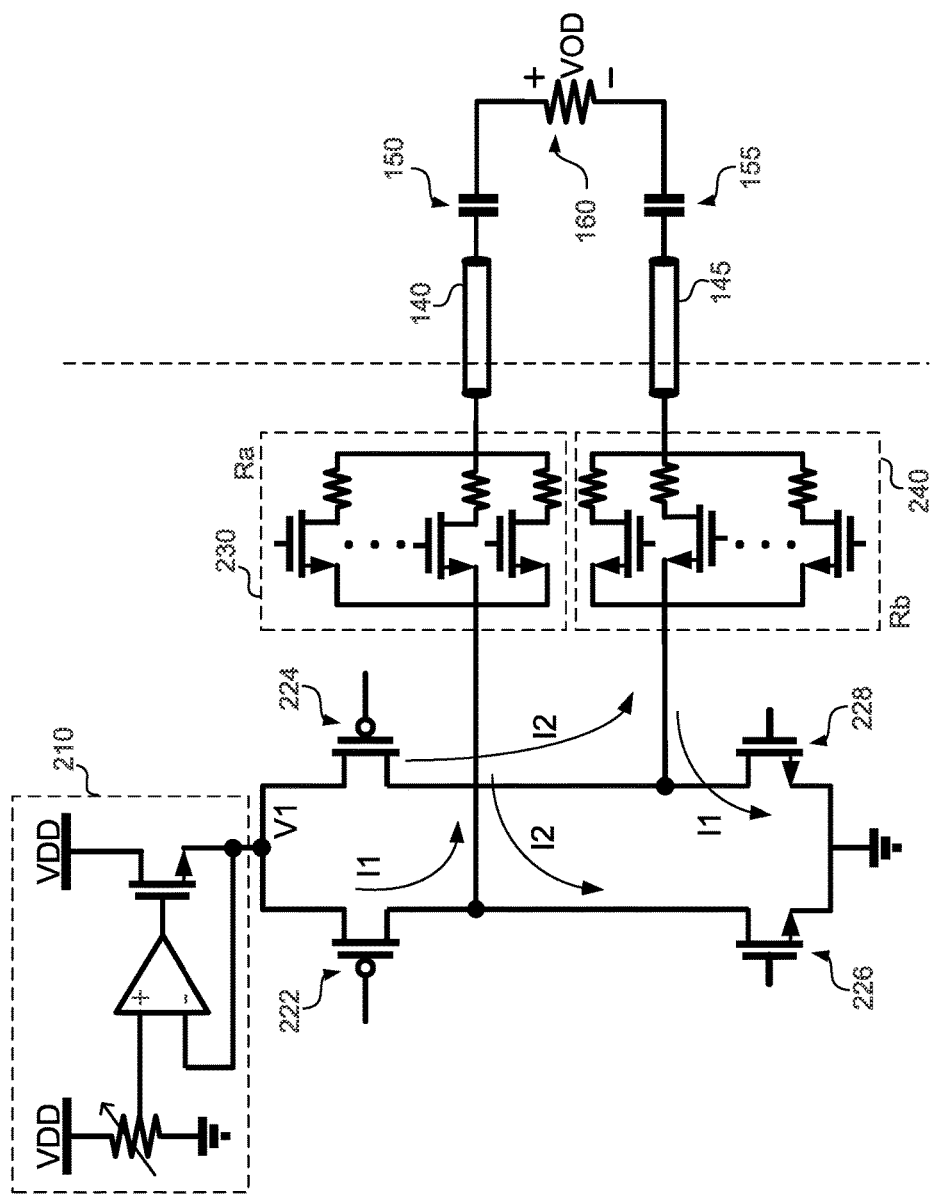
FIG. 6 is a circuit diagram of an LVDS driving circuit according to an embodiment of the present invention.

FIG. 6 shows a circuit diagram of an LVDS driving circuit according to a preferred embodiment of the present invention. As shown, the voltage generating unit 210 is implemented by an LDO regulator shown in FIG. 3B, the switch 222, the switch 224, the switch 226 and the switch 228 are implemented by MOS, and each of the resistor 230 and the resistor 240 is formed by a plurality of sub-resistors, i.e., implemented by the parallel sub-resistors in FIG. 5 (respective equivalent resistance values being Ra and Rb). If the resistance values of the MOS are omitted, for both of the conduction paths corresponding to the current I1 and the current I2, the resistance value of the matching impedance Ra+Rb needs to be equal to the resistance value R of the resistor 160. Preferably, for example but not limited to, Ra and Rb are designed to be R/2.

Figure 7:
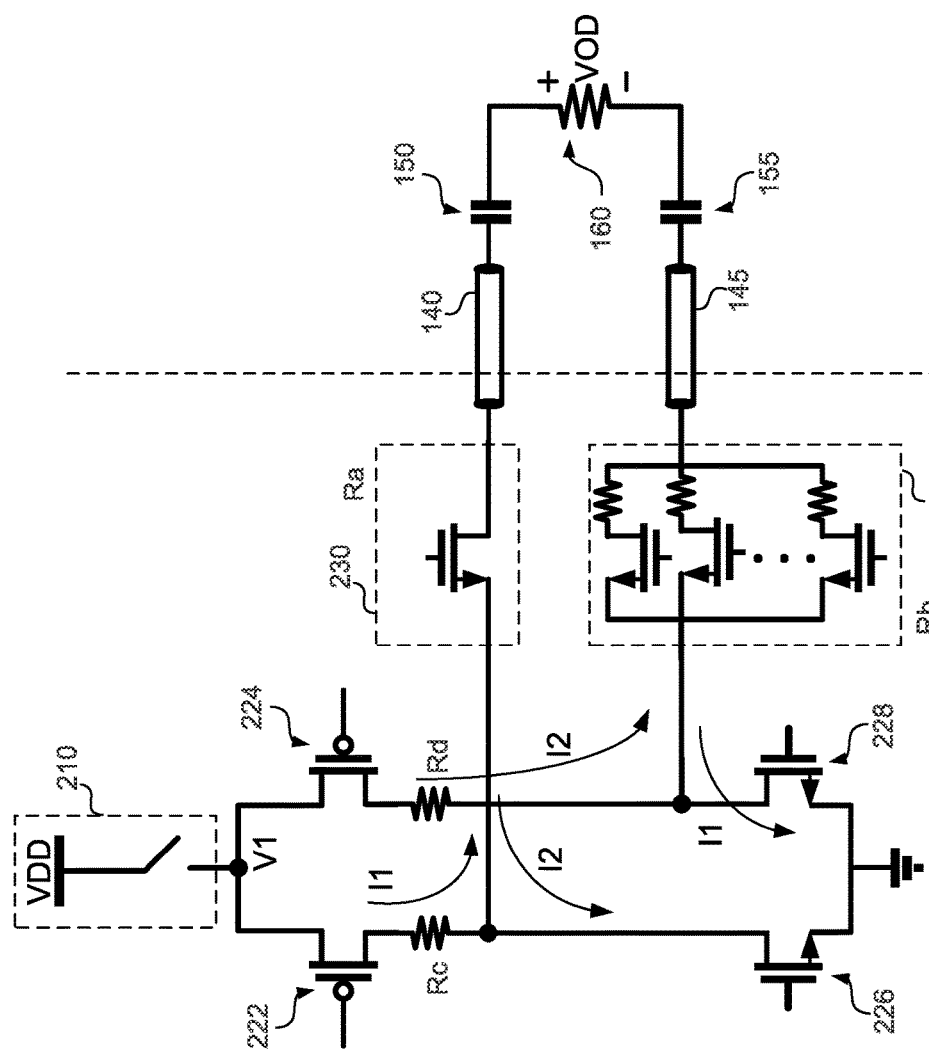
FIG. 7 is a circuit diagram of an LVDS driving circuit according to another embodiment of the present invention.

FIG. 7 shows a circuit diagram of an LVDS driving circuit according to another embodiment of the present invention. As shown, the voltage generating unit 210 is implemented by the switch shown in FIG. 3A, the switch 222 and the switch 224 are formed by PMOS and each connected to a resistor (the resistance value being Rc and Rd) in series, the resistor 230 is implemented by an NMOS (the equivalent resistance value being Ra) biased in the active region, and the resistor 240 is implemented by the sub-resistors in a parallel connection shown in FIG. 5 (the equivalent resistance value being Rb). The equivalent resistance of the conduction path corresponding to the current I1 is Ra+Rb+Rc, and the equivalent resistance of the conduction path corresponding to the current I2 is Ra+Rb+Rd, wherein Ra+Rb+Rc and Ra+Rb+Rd need to be equal to the resistance value R of the load resistor. To simplify the circuit design, Ra and Rb may be caused to be constant values, and Rc is equal to Rd. Alternatively, Rc and Rd may be designed to be unequal, and an additional timing controlling circuit (not shown) is used to appropriately control the resistance value of the NMOS of the resistor 230 or the on/off states of multiple NMOS of the resistor 240 in conduction stages of different switches (i.e., different conduction paths), to adjust the equivalent resistance values of the resistor 230 and the resistor 240. As such, at any time point, Ra+Rb+Rc and Ra+Rb+Rd need to be equal to the resistance value R of the resistor160 to achieve the effect of impedance matching.

Figure 8:
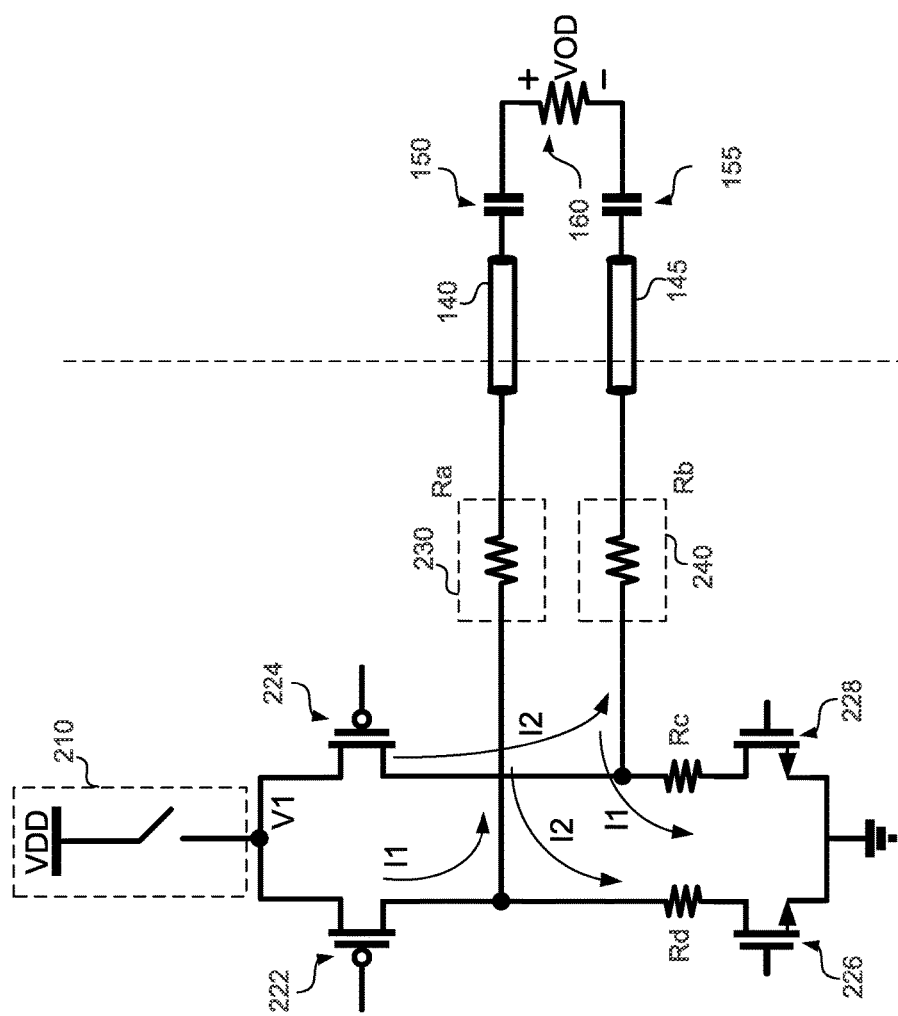
FIG. 8 is a circuit diagram of an LVDS driving circuit according to another embodiment of the present invention.

FIG. 8 shows a circuit diagram of an LVDS driving circuit according to another preferred embodiment of the present invention. As shown, the voltage generating unit 210 is implemented by the switch shown in FIG. 3A, the switch 222 and the switch 224 are PMOS, the resistor 230 and the resistor 240 are resistors respectively having resistance values Ra and Rb, the switch 226 and the switch 228 are NMOS and each connected to a resistor (having a resistance value of Rd and Rc) in series. Assuming that the resistance value of the MOS is omitted, the equivalent resistance of the conduction path corresponding to the current i1 is Ra+Rb+

Rc, and the equivalent resistance of the conduction path corresponding to the current I2 is Ra+Rb+Rd, wherein Ra+Rb+Rc and Ra+Rb+Rd need to be equal to the resistance value R of the load resistor.

Figure 9:
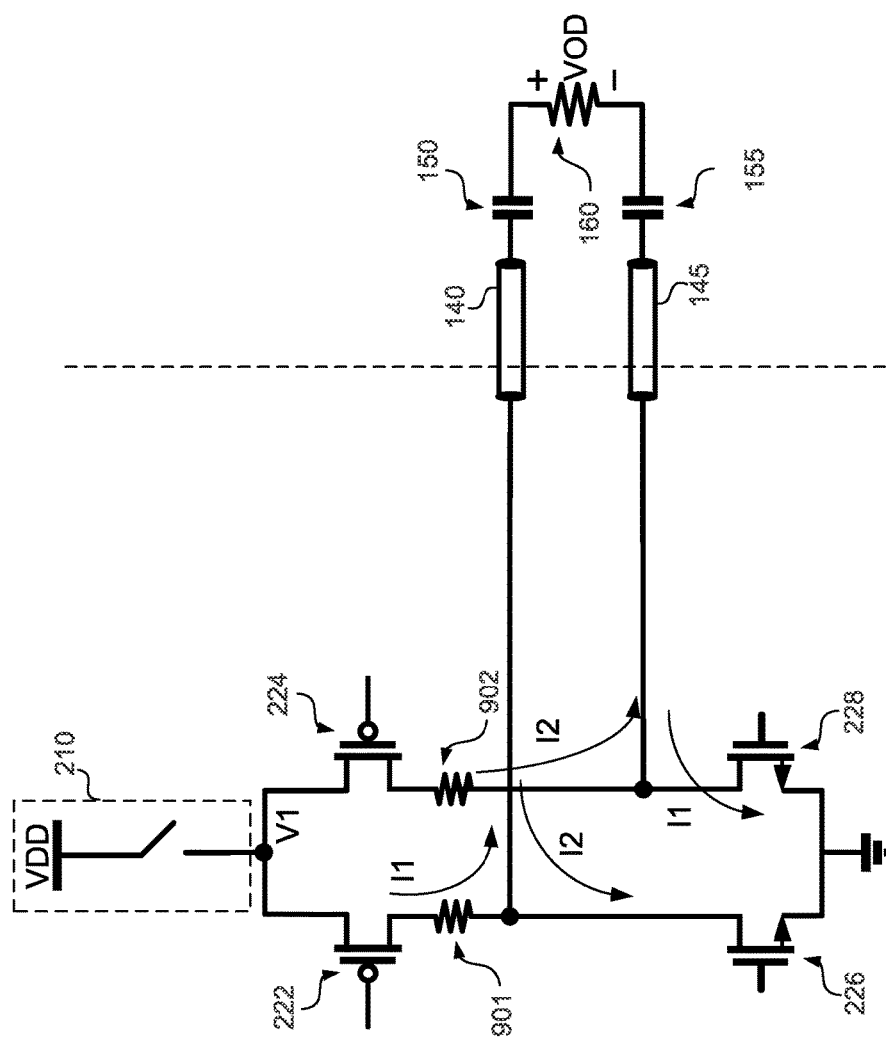
FIG. 9 is a circuit diagram of an LVDS driving circuit according to yet another embodiment of the present invention.

FIG. 9 shows a circuit diagram of an LVDS driving circuit according to yet another preferred embodiment of the present invention. As shown, the equivalent resistance on the conduction path corresponding to the current I1 is provided by a resistor 901, and the equivalent resistance on the conduction path corresponding to the current I2 is provided by a resistor 902. Thus, both of the resistance value of the resistor 901 and the resistance value of the resistor 902 need to be equal to the resistance value R of the load resistor 160. The resistor 901 has one end coupled to the switch 222, and the other end coupled to the switch 226 and the output end of the LVDS driving circuit. The resistor 902 has one end coupled to the switch 224, and the other end coupled to the switch 228 and the other output end of the LVDS driving circuit.

Figure 10:
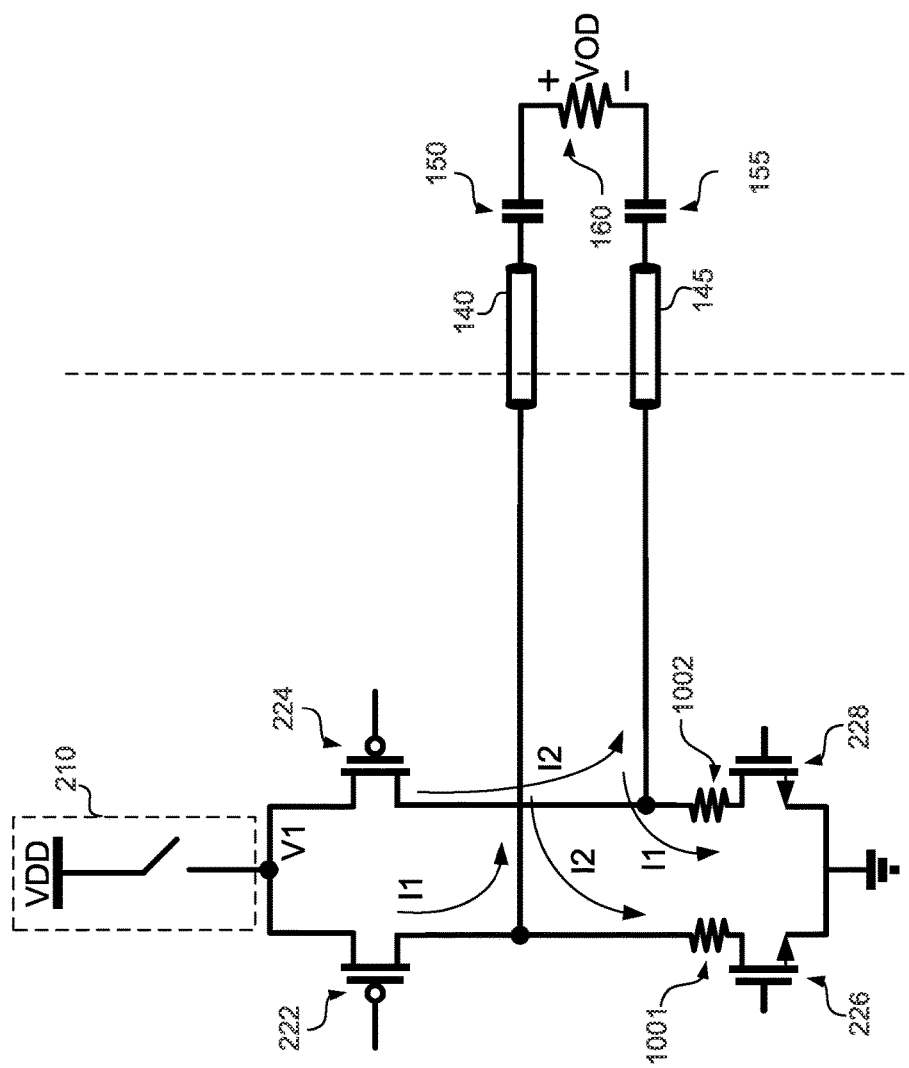
FIG. 10 is a circuit diagram of an LVDS driving circuit according to yet another embodiment of the present invention.

FIG. 10 shows a circuit diagram of an LVDS driving circuit according to yet another preferred embodiment of the present invention. Similar to the embodiment in FIG. 9, the equivalent resistance on the conduction path corresponding to the current I1 is provided by a resistor 1002, and the equivalent resistance on the conduction path corresponding to the current I2 is provided by a resistor 1001. Thus, both of the resistance value of the resistor 1001 and the resistance value of the resistor 1002 need to be equal to the resistance value R of the load resistor 160. The resistor 1001 has one end coupled to the switch 226, and the other end coupled to the switch 222 and the output end of the LVDS driving circuit. The resistor 1002 has one end coupled to the switch 228, and the other end coupled to the switch 224 and the other output end of the LVDS driving circuit.

The aforementioned LVDS driving circuit (any of the LVDS driving circuits in the embodiments in FIG. 2 and FIG. 6 to FIG. 10) is substantially an improved voltage-driven differential signaling driving circuit. It should be noted that, the shapes, sizes, ratios and sequences of the steps in the drawings are examples for explaining the present invention to one person skilled in the art, not limiting the present invention. In possible implementation, one skilled person in the art would selectively implement part or all technical features of any embodiment of the application or selectively combine part or all technical features of the embodiments of the application based on the disclosure of the present invention to enhance the implementation flexibility of the present invention.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A low-voltage differential signaling (LVDS) driving circuit, coupled to a load resistor via a first output end and a second output end, comprising:
   a voltage generating unit, providing a first reference voltage;
   a first switch, coupled between the voltage generating unit and a first node;
   a second switch, coupled between the voltage generating unit and a second node;
   a third switch, coupled between the first node and a third node, the third node having a second reference voltage;
   a fourth switch, coupled between the second node and the third node;
   a first resistor, coupled between the first node and the first output end; and
   a second resistor, coupled between the second node and the second output end;
   wherein, the first resistor and the second resistor are in a series connection with the load resistor, and
   wherein a sum of a resistance value of the first resistor and a resistance value of the second resistor is equal to a resistance value of the load resistor.

2. The LVDS driving circuit according to claim 1, further comprising:
   a third resistor, coupled between the first node and the first switch.

3. The LVDS driving circuit according to claim 1, further comprising:
   a third resistor, coupled between the first node and the third switch.

4. The LVDS driving circuit according to claim 1, wherein one of the first resistor and the second resistor comprises:
   a plurality of sub-resistors; and
   a plurality of switches;
   wherein, each of the sub-resistors and the corresponding switch are in a series connection to form a series structure, the series structures are in a parallel connection, and a resistance value of one of the first resistor and the second resistor is determined by on/off states of the switches.

5. The LVDS driving circuit according to claim 1, wherein the voltage generating unit is a low-voltage dropout (LDO) regulator.

6. A low-voltage differential signaling (LVDS) driving circuit, coupled to a load resistor via a first output end and a second output end, comprising:
   a voltage generating unit, providing a first reference voltage;
   a first switch, coupled between the voltage generating unit and a first node;
   a second switch, coupled between the voltage generating unit and a second node;
   a third switch, coupled between the first node and a third node, the third node having a second reference voltage;
   a fourth switch, coupled between the second node and the third node; and
   a plurality of resistors;
   wherein, when the first switch and the fourth switch are turned on and the second switch and the third switch are turned off, the first switch, the first node, the fourth switch, the second node and the load resistor form a current path, a part of resistors are located on the current path and are in a series connection with the load resistor, and
   wherein the part of the resistors and the load resistor have a same resistance value.

7. The LVDS driving circuit according to claim 6, wherein the resistors comprise a first resistor and a second resistor, the first resistor is coupled between the first node and the first output end, and the second resistor is coupled between the second node and the second output end.

8. The LVDS driving circuit according to claim 7, wherein a sum of a resistance value of the first resistor and a resistance value of the second resistor is equal to a resistance value of the load resistor.

9. The LVDS driving circuit according to claim 7, wherein the part of the resistors further comprise a third resistor coupled between the first node and the first switch.

10. The LVDS driving circuit according to claim 7, wherein the part of the resistors further comprise a third resistor coupled between the first node and the third switch.

11. The LVDS driving circuit according to claim 7, wherein one of the first resistor and the second resistor comprises:
  a plurality of sub-resistors; and
  a plurality of switches;
  wherein, each of the sub-resistors and the corresponding switch are in a series connection to form a series structure, the series structures are in a parallel connection, and a resistance value of one of the first resistor and the second resistor is determined by on/off states of the switches.

12. The LVDS driving circuit according to claim 7, wherein one of the first resistor and the second resistor is an NMOS transistor.

13. The LVDS driving circuit according to claim 6, wherein the part of the resistors comprise a resistor coupled between the first node and the first switch.

14. The LVDS driving circuit according to claim 6, wherein the part of the resistors comprise a resistor coupled between the first node and the third switch.

15. A low-voltage differential signaling (LVDS) driving circuit, coupled to a load resistor via a first output end and a second output end, comprising:
  a voltage generating unit, providing a first reference voltage;
  a first switch, coupled between the voltage generating unit and a first node;
  a second switch, coupled between the voltage generating unit and a second node;
  a third switch, coupled between the first node and a third node, the third node having a second reference voltage;
  a fourth switch, coupled between the second node and the third node;
  a first resistor, coupled between the first node and the first output end; and
  a second resistor, coupled between the second node and the second output end;
  wherein, the first resistor and the second resistor are in a series connection with the load resistor, and
  wherein one of the first resistor and the second resistor is an NMOS transistor.

16. A low-voltage differential signaling (LVDS) driving circuit, coupled to a load resistor via a first output end and a second output end, comprising:
  a voltage generating unit, providing a first reference voltage;
  a first switch, coupled between the voltage generating unit and a first node;
  a second switch, coupled between the voltage generating unit and a second node;
  a third switch, coupled between the first node and a third node, the third node having a second reference voltage;
  a fourth switch, coupled between the second node and the third node; and
  a plurality of resistors;
  wherein, when the first switch and the fourth switch are turned on and the second switch and the third switch are turned off, the first switch, the first node, the fourth switch, the second node and the load resistor form a current path, a part of resistors are located on the current path and are in a series connection with the load resistor, and
  wherein the voltage generating unit is a low-voltage dropout (LDO) regulator.

* * * * *